United States Patent
Kim et al.

(10) Patent No.: US 10,133,550 B2
(45) Date of Patent: Nov. 20, 2018

(54) TERNARY DIGIT LOGIC CIRCUIT

(71) Applicant: UNIST(ULSAN NATIONAL INSTITUTE OF SCIENCE AND TECHNOLOGY), Ulsan (KR)

(72) Inventors: Kyung Rok Kim, Ulsan (KR); Sun Hae Shin, Ulsan (KR); E San Jang, Ulsan (KR); Jae Won Jeong, Ulsan (KR)

(73) Assignee: UNIST(ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 0 days.

(21) Appl. No.: 15/563,473

(22) PCT Filed: Dec. 29, 2015

(86) PCT No.: PCT/KR2015/014377
§ 371 (c)(1),
(2) Date: Sep. 29, 2017

(87) PCT Pub. No.: WO2017/010637
PCT Pub. Date: Jan. 19, 2017

(65) Prior Publication Data
US 2018/0074788 A1    Mar. 15, 2018

(30) Foreign Application Priority Data

Jul. 10, 2015   (KR) .................. 10-2015-0098638

(51) Int. Cl.
*H03K 3/29* (2006.01)
*G06F 7/48* (2006.01)
(Continued)

(52) U.S. Cl.
CPC .................. *G06F 7/48* (2013.01); *G06F 7/49* (2013.01); *H03K 19/0016* (2013.01);
(Continued)

(58) Field of Classification Search
CPC .................. G06F 7/48; H03K 19/0016; H03K 19/00315; H03K 19/00361; H03K 19/09429
See application file for complete search history.

(56) References Cited

U.S. PATENT DOCUMENTS 3,600,603 A * 8/1971 Watanabe ................ H03K 3/29
326/124
6,133,754 A * 10/2000 Olson ................ H03K 19/0008
326/112
(Continued)

FOREIGN PATENT DOCUMENTS

JP    2006-033060 A    2/2006
JP    2008-187384 A    8/2008
(Continued)

OTHER PUBLICATIONS

Wang, Complementary tunneling transistor for low power application, May 6, 2004, Solid-State Electronics 48 (2004), 2281-2286.*
(Continued)

*Primary Examiner* — Alexander H Taningco
*Assistant Examiner* — Kurtis R Bahr
(74) *Attorney, Agent, or Firm* — Klarquist Sparkman, LLP

(57) ABSTRACT

A ternary logic circuit according to the present invention includes a pull-up device (100) and a pull-down device (200) connected in series between power voltage sources ($V_{DD}$ and GND), and an input voltage ($V_{IN}$) source and output voltage ($V_{OUT}$) source. When both the pull-up device (100) and the pull-down device (200) are turned off by an input voltage ($V_{IN}$), both the pull-up device (100) and the pull-down device (200) operate as simple resistors which are affected only by an output voltage ($V_{OUT}$) and form a ternary digit ("1" state) through voltage division. When only one of the pull-up device (100) or the pull-down device (200) is turned on to allow a current to flow therethrough, $V_{DD}$ ("2"
(Continued)

state) or GND ("0" state) is output as the output voltage ($V_{OUT}$). Accordingly, a bit density can be remarkably increased.

3 Claims, 4 Drawing Sheets

(51) Int. Cl.
H03K 19/0948 (2006.01)
H03K 19/20 (2006.01)
H03K 19/00 (2006.01)
H03K 19/003 (2006.01)
H03K 19/094 (2006.01)
G06F 7/49 (2006.01)

(52) U.S. Cl.
CPC . H03K 19/00315 (2013.01); H03K 19/00361 (2013.01); H03K 19/0948 (2013.01); H03K 19/09429 (2013.01); H03K 19/20 (2013.01)

(56) References Cited

U.S. PATENT DOCUMENTS 6,310,492 B1 10/2001 Ikoma et al.
7,567,094 B2 * 7/2009 Shastri ............. H03K 19/09429
326/56
2008/0183793 A1 7/2008 Motoyama
2009/0295428 A1 * 12/2009 Hibino ............... H03K 19/0002
326/59
2014/0292373 A1 * 10/2014 Wang ................. H03K 19/0963
326/97
2016/0133695 A1 * 5/2016 Huang ................... H01L 29/36
257/9

FOREIGN PATENT DOCUMENTS

KR 20-1994-0008249 Y 12/1994
KR 10-2000-0077151 A 12/2000
KR 10-2001-0082557 A 8/2001
WO WO 99/63669 12/1999

OTHER PUBLICATIONS

World Intellectual Property Organization, International Search Report and Written Report, dated Apr. 28, 2016, issued in International Application No. PCT/KR2015/014377.

* cited by examiner

[Fig. 1]
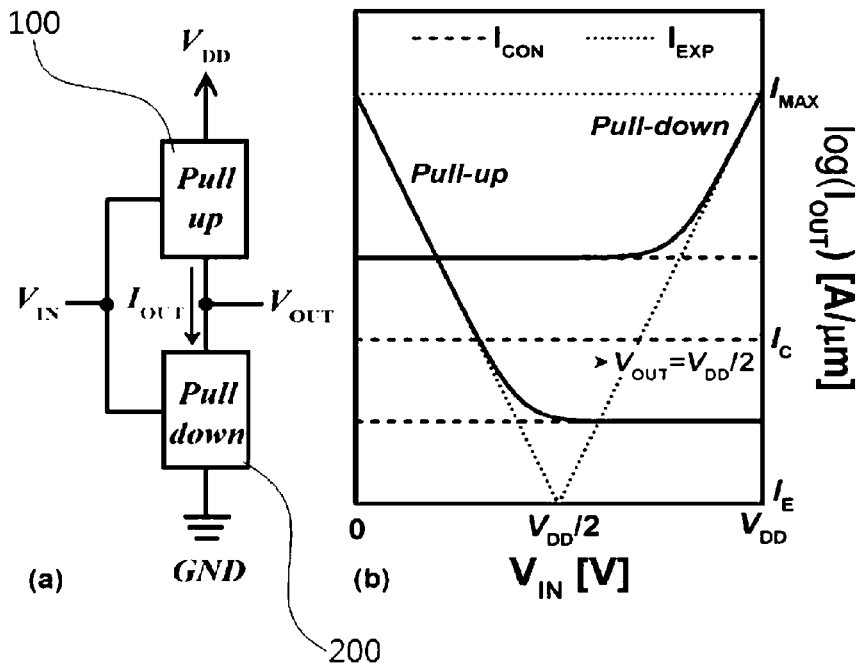
[Fig. 2]
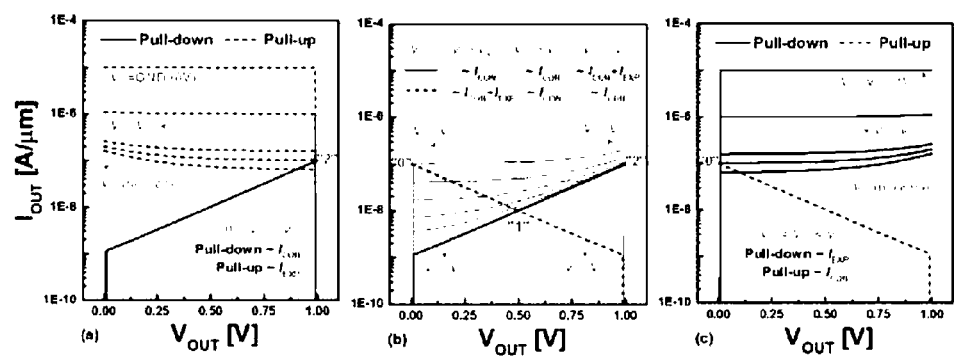

[Fig. 3]
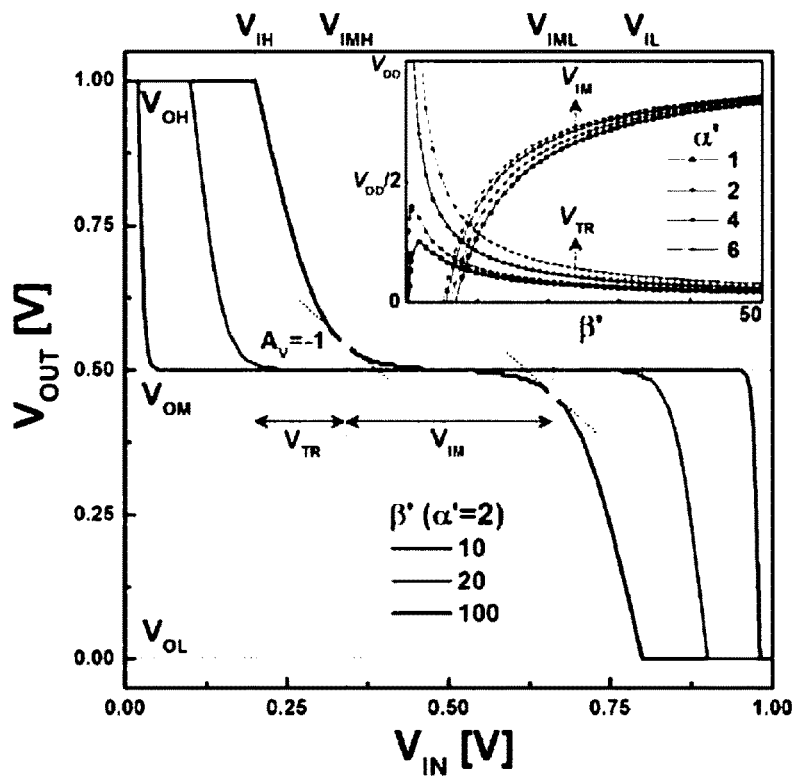
[Fig. 4]
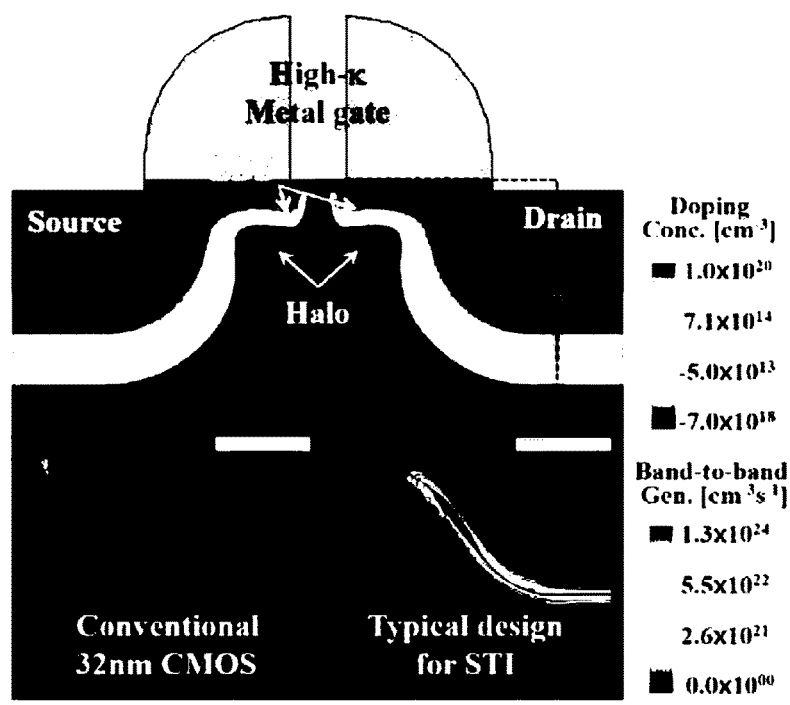

[Fig. 5]
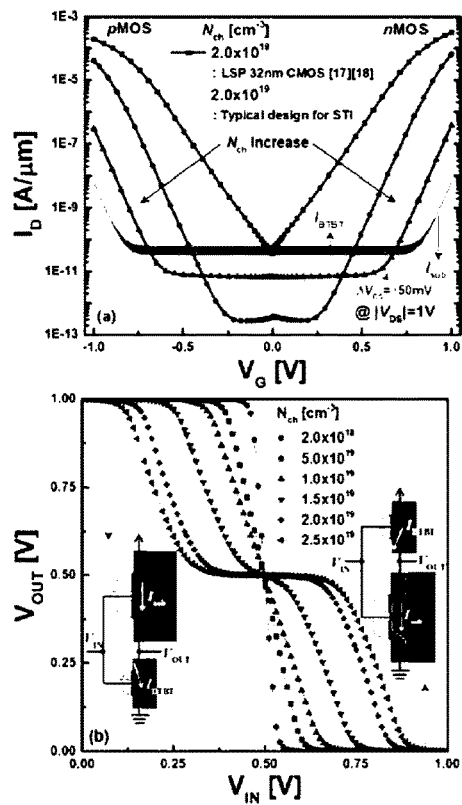
[Fig. 6]
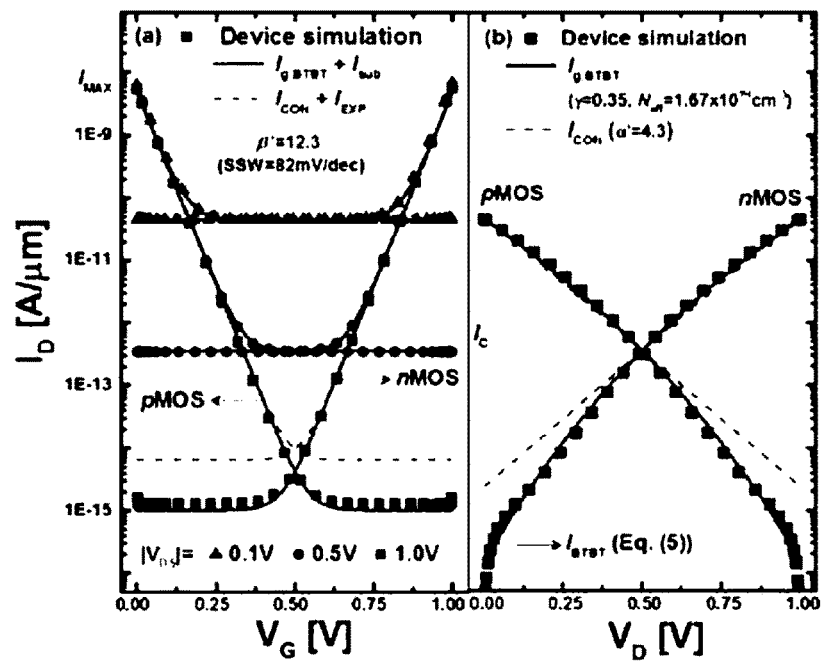

[Fig. 7]
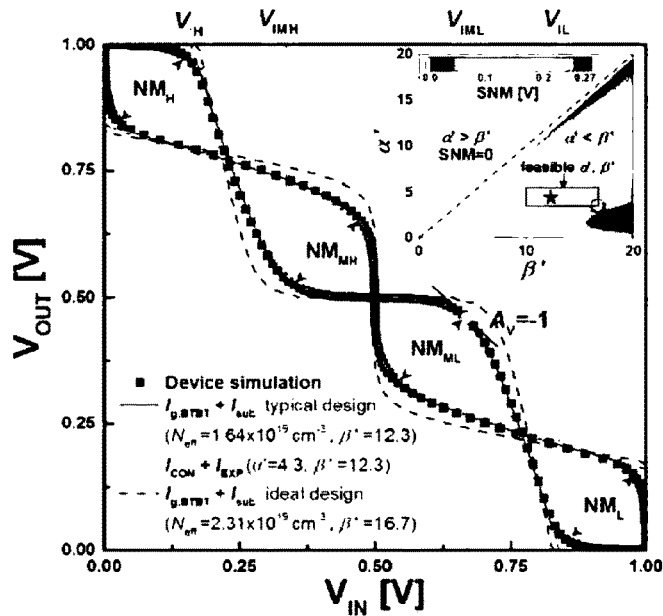
[Fig. 8]
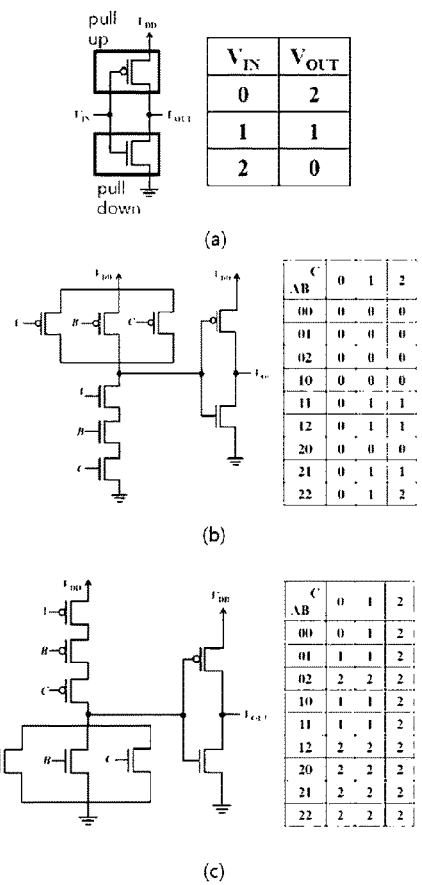

TERNARY DIGIT LOGIC CIRCUIT

TECHNICAL FIELD

The present invention relates to a ternary logic device and circuit, and more specifically, to a ternary logic device and circuit capable of increasing the bit density by using a junction band-to-band tunneling (BTBT) leakage current and subthreshold current mechanism in an off state to create a ternary logic gate with the same circuit configuration as a CMOS-based binary logic gate.

BACKGROUND ART

A conventional binary logic based digital system has focused on increasing the bit density through miniaturization of CMOS device so as to quickly process a large amount of data. However, due to recent integration of sub-30 nm structures, there has been a limitation in increasing the bit density due to a leakage current and an increase in power consumption caused by a quantum tunneling effect. In order to overcome such limitation regarding the bit density, ternary logic devices and circuits have attracted much attention. In particular, most efficient ternary logic and its basic unit, standard ternary inverter (STI), has been actively developed. However, unlike a conventional binary inverter that uses a single CMOS with a single power source, conventional techniques for an STI require more power sources or complicated circuit configurations.

PRIOR ART DOCUMENT

Patent Document

Korean Utility Model Publication No. 20-1994-0008249 (1994 Dec. 5)

DETAILED DESCRIPTION OF THE INVENTION

Technical Problem

In order to solve the above-described problems, the present invention proposes a compact low-power ternary logic circuit that overcomes the limitation regarding power and bity density in conventional binary logic and previous ternary logic.

Technical Solution

A ternary logic circuit according to the present invention includes a pull-up device (100) and a pull-down device (200) connected in series between power voltage sources ($V_{DD}$ and GND), and an input voltage ($V_{IN}$) source and an output voltage ($V_{OUT}$) source, wherein, when both the pull-up device (100) and the pull-down device (200) are turned off by an input voltage ($V_{IN}$), both the pull-up device (100) and the pull-down device (200) operate as simple resistors which are affected only by an output voltage ($V_{OUT}$) and form a ternary digit ("1" state) through voltage division, and when only one of the pull-up device (100) or the pull-down device (200) is turned on to allow a current to flow therethrough, $V_{DD}$ ("2" state) or GND ("0" state) is transferred as the output voltage ($V_{OUT}$).

Advantageous Effects of the Invention

A ternary logic circuit according to the present invention has an effect of increasing the bit density and decreasing power density by using a junction BTBT leakage current and a subthreshold current mechanism in an off state to create a ternary logic gate with the same circuit configuration as a CMOS-based binary logic gate.

DESCRIPTION OF THE DRAWINGS

FIG. 1 illustrates a configuration diagram of a ternary logic circuit including a pull-up device and a pull-down device, according to the present invention, and an output current-input voltage characteristic graph of the pull-up device and the pull-down device.

FIG. 2 illustrates an operating principle of an STI according to output current-output voltage characteristics of the pull-up device and the pull-down device.

FIG. 3 illustrates a mathematical voltage transfer curve of STI.

FIG. 4 illustrates a planar 32-nm nMOS device structure and BTBT occurrence rates at a low channel doping and a high channel doping.

FIG. 5 illustrates output current-input voltage characteristics of ternary CMOS and a voltage transfer curve of STI according to a channel doping.

FIG. 6 illustrates a comparison between simulated current-voltage data and modeled current-voltage based on [Equation 1].

FIG. 7 illustrates voltage transfer characteristics and static noise margin analysis.

FIG. 8 illustrates circuit configurations and truth tables of ternary inverter, ternary minimum (MIN), and ternary maximum (MAX) gates.

BEST MODE

Hereinafter, embodiments of the present invention will be described in more detail with reference to the accompanying drawings. Terms and words used in the present specification and the claims should not be construed as limited to ordinary or dictionary terms, and should be construed in accordance with the meaning and concept consistent with the technical idea of the present invention based on the principle the inventors can properly define the concept of the terms so as to describe their invention in the best way.

Therefore, the embodiments described in the present specification and the configurations illustrated in the drawings are only the most preferred embodiments of the present invention and do not represent all the technical ideas of the present invention. Therefore, it should be understood that various equivalents and modifications may be substituted for those at the time of the present application.

FIG. 1 illustrates a configuration diagram of a ternary logic circuit including a pull-up device and a pull-down device, according to the present invention.

As illustrated in FIG. 1(a), the ternary logic circuit according to the present invention includes a pull-up device 100 and a pull-down device 200.

As illustrated in FIGS. 1(a) and 1(b), current-voltage characteristics of the ternary logic device according to the present invention have a current ($I_{CON}$) component, which is not affected by an input voltage and is affected only by an output voltage, and a current ($I_{EXT}$) component, which is affected by an input voltage and is not affected by an output voltage.

The current $I_{CON}$, which is affected by the output voltage, has a current value $I_C$ when the output voltage $V_{OUT}$ is half the operating voltage $V_{DD}$ ($V_{OUT}=V_{DD}/2$), and the current $I_{EXT}$, which is affected by the input voltage, has a current value $I_E$ when the input voltage $V_{IN}$ is half the operating voltage $V_{DD}$ ($V_{IN}=V_{DD}/2$) and exponentially increases to a maximum current $I_{MAX}$ at a point where the input voltage $V_{IN}$ and the operating voltage $V_{DD}$ are equal to each other ($V_{IN}=V_{DD}$).

In this case, $I_E$, $I_C$, and $I_{MAX}$ are characterized by the relationship "$I_E<I_C<I_{MAX}$".

Complementary current-voltage characteristics for the operation of the ternary logic device according to the present invention may be represented by the following equation.

$$I_{OUT}(V_{IN}, V_{OUT}) = I_{CON}(V_{OUT}) + I_{EXP}(V_{IN})$$
$$= I_C \exp\left[\pm\alpha\left(V_{OUT}-\frac{V_{DD}}{2}\right)\right] + I_E \exp\left[\pm\beta\left(V_{IN}-\frac{V_{DD}}{2}\right)\right]$$

[Equation 1]

In [Equation 1], $\alpha$ and $\beta$ are exponential coefficients of each current mechanism, and + and − signs before $\alpha$ and $\beta$ are respectively applied to the pull-down device 200 and the pull-up device 100.

Here, $I_{MAX}=I_E\exp[\beta(V_{DD}/2)]$ is equal in both the pull-down device 200 and the pull-up device 100.

The operation principle of the ternary logic circuit according to the present invention will be described with reference to [Equation 1] and FIG. 2.

FIGS. 2(*a*) to 2(*c*) illustrate a voltage transition process of three states: a low "0" state, an intermediate "1" state, and a high "2" state. The low "0", the intermediate "1", and the high "2" states are determined by intersection points of the output current ($I_{OUT}$)-output voltage($V_{OUT}$) curves of the pull-up device 100 and the pull-down device 200.

To transition to the low "0" state or the high "2" state, the pull-up device 100 or the pull-down device 200 shows a dominant current of $I_{EXP}$ within a range of $V_{IN}>V_{IL}$ (FIG. 2(*a*)) or $V_{IN}<V_{IH}$ (FIG. 2(*b*)) as $I_{OUT}$ to $I_{EXP}$ and make a current path in GND ($V_{OL}$) or the operating voltage ($V_{DD}$) ($V_{OH}$).

While the output current $V_{OUT}$ transitions to $V_{DD}/2$ around $V_{IMH}$ and $V_{IML}$, the output current $I_{OUT}$ of the pull-up device 100 and the pull-down device 200 is similar to the sum of the constant current $I_{CON}$ and the exponential current $I_{EXP}$, and this may induce a slow transition process.

Finally, an additional intermediate "1" state $V_{OM}$ is obtained at one intersection point at $V_{OUT}=V_{DD}/2$ within a range of $V_{IMH}<V_{IN}<V_{IML}$, and the output current $I_{OUT}$ of the pull-up device 100 and the pull-down device 200 is dominated only by the constant current $I_{CON}$ (FIG. 2(*b*)).

When assuming a symmetrical device having $I_{MAX}>I_C$, an intermediate input voltage ($V_{IM}=V_{IML}-V_{IMH}$) and a transition voltage ($V_{TR}=V_{IMH}-V_{IH}=V_{IL}-V_{IML}$) may be determined according to [Equation 2] and [Equation 3] below.

$$V_{IM} = V_{DD} - \frac{2}{\beta}\ln\left(\frac{I_{MAX}}{I_C}\right) - \frac{2}{\beta}\ln\left(\frac{\beta}{2\alpha}\right)$$

[Equation 2]

$$V_{TR} = \frac{\alpha}{\beta}\frac{V_{DD}}{2} + \frac{1}{\beta}\ln\left(\frac{\beta}{2\alpha}\right)$$

[Equation 3]

Here, $V_{IL}$, $V_{IH}$, $V_{IML}$, and $V_{IMH}$ are determined via a combination of current equations of the pull-up device 100 and the pull-down device 200.

For example, when $V_{IN}>V_{DD}/2$, $V_{IML}$ is obtained from a relationship of $\{I_{EXP}+I_{CON}\}_{pull-down}=\{I_{CON}\}_{pull-up}$ by $dV_{OUT}/dV_{IN}=-1$.

For operation of a STI, it is required to satisfy the conditions $V_{IL}<V_{DD}$, $V_{IML}>V_{DD}/2$, $V_{IMH}<V_{DD}/2$, and $V_{IH}>0$ (GND). Consequently, the criteria for $\alpha$ and $\beta$ are as follows.

$$\alpha' = \frac{\alpha}{\ln(10)} < \log\left(\frac{I_{MAX}}{I_C}\right)\bigg/\frac{V_{DD}}{2} \ll \beta' = \frac{\beta}{\ln(10)}$$

[Equation 4]

In FIG. 2, as a mathematical example, $I_{MAX}=10^{-5}$A, $I_C=10^{-8}$A, $\log(I_{MAX}/I_C)/(V_{DD}/2)=6$, $\alpha'=2$, $\beta'=10$, and $V_{DD}=1$ are used.

FIG. 3 illustrates a voltage transfer curve of the standard ternary inverter (STI) having three output states ($V_{OH}=V_{DD}$, $V_{OM}=V_{DD}/2$, $V_{OL}=$GND) as a function of $\beta'$ and $\alpha'$, and consequently, shows a change of $V_{IM}$ by [Equation 2] and the transition voltage by [Equation 3].

As shown in a graph inserted into FIG. 3, the low transition voltage $V_{TR}$ and the high $V_{IM}$ may be obtained by larger $\beta'$ and smaller $\alpha'$ within a range of $\alpha'$ and $\beta'$ given by [Equation 4]. This is preferable for the voltage transfer curve of the ideal standard ternary inverter (STI).

However, both the pull-up device 100 and the pull-down device 200 have a specific saturated value due to the $\log(\beta/2\alpha')/\beta'$ term in [Equation 2] and [Equation 3].

In the $\beta'$ term, such a nonlinear $\log(x)/x$ function is induced at $V_{IMH}$ and $V_{IML}$ around $V_{DD}/2$ at which the output current $I_{OUT}$ of the pull-up device 100 and the pull-down device 200 is approximated as the sum of the constant current $I_{CON}$ and the exponential current $I_{EXP}$.

When considering only the transition voltage $V_{TR}$, large $\beta'$ seems to be preferable. However, when considering noise margin, it is expected that there will be an optimal condition for reasonable $V_{IM}$.

The constant current $I_{CON}$ independent of the input voltage, which is a current mechanism essential for the intermediate "1" state of the STI, may be realized by a junction BTBT current ($I_{BTBT}$) independent of a gate voltage.

In addition, the exponential current $I_{EXP}$ dependent on the input voltage for the "0" and "2" states may be made into a subthreshold current ($I_{sub}$).

FIG. 4 illustrates a cross-section of a 32-nm high-k/metal-gate planar nMOS and BTBT occurrence rates at a low channel doping (Nch=$2\times10^{18}$ cm$^{-3}$) and a high channel doping (Nch=$2\times10^{19}$ cm$^{-3}$). Basic structure information such as an equivalent oxide thickness of 1 nm, a high drain doping (HDD) of $1\times10^{20}$ cm$^{-3}$, and a low drain doping (LDD) of $2.5\times10^{19}$ cm$^{-3}$ was based on 32-nm low static power technology reported in ITRS. A device simulation was performed via Synopsys Sentaurus™ based on a BTBT model and a bandgap narrowing model.

By increasing a channel doping, a maximum BTBT occurrence region moves from the LDD region below the gate to the HDD and body junction. This make a dominant off current mechanism become gate bias-independent $I_{BTBT}$.

FIG. 5 illustrates output current-input voltage characteristics of ternary CMOS and a voltage transfer curve of STI according to a channel doping. It can be seen that a simple increase in a channel doping changes the current-voltage characteristic from CMOS to tenary CMOS and changes the voltage transfer curve from binary inverter to ternary inverter.

FIG. 6 shows that simulated current-voltage data is well matched with a modeled current-voltage based on [Equation 1].

FIG. 7 illustrates voltage transfer characteristics and static noise margin analysis. SNM has 200 mV in a typical design (Nch=$2\times10^{19}$ cm$^{-3}$) and 230 mV in an ideal CMOS. In an SNM contour inserted into FIG. 7, it can be seen that NM increases as β becomes larger and α becomes smaller.

A STI circuit having the above-described characteristics, according to the present invention, and a truth table thereof, a MIN gate circuit, to which the STI circuit is applied, and a truth table thereof, and a MAX gate circuit and a truth table thereof are illustrated in FIG. 8.

In a case where the pull-up device 100 and the pull-down device 200 are not affected by the input voltage (in a case where both are turned off), both the two devices operate as simple resistors and form a ternary digit ("1" state) through voltage division. On the other hand, when only one of the pull-up device 100 and the pull-down device 200 is turned on to allow a current to flow therethrough, $V_{DD}$ ("2" state) or GND ("0" state) is transferred.

As described above, the current region which is not affected by the input voltage can be implemented by $I_{BTBT}$ characteristics which are not affected by the gate of the CMOS, and the current region increasing exponentially to the input voltage uses $I_{sub}$ of the CMOS.

While the present invention has been particularly shown and described with reference to specific embodiments, it should be understood that the invention is not limited thereto and various modifications and changes may be made without departing from the scope of the present invention and the equivalents of the appended claims by those of ordinary skill in the art to which the invention pertains.

DESCRIPTION OF REFERENCE NUMERALS

100: pull-up device
200: pull-down device

The invention claimed is:

1. A ternary logic circuit comprising:
a pull-up device (100) and a pull-down device (200) connected in series between power voltage sources ($V_{DD}$ and GND); and
an input voltage ($V_{IN}$) source and an output voltage ($V_{OUT}$) source,
wherein, when both the pull-up device (100) and the pull-down device (200) are turned off by an input voltage ($V_{IN}$), both the pull-up device (100) and the pull-down device (200) operate as simple resistors which are affected only by an output voltage ($V_{OUT}$) and form a ternary digit ("1" state) through voltage division, and
when only one of the pull-up device (100) or the pull-down device (200) is turned on to allow a current to flow therethrough, $V_{DD}$ ("2" state) or GND ("0" state) is transferred as the output voltage ($V_{OUT}$),
wherein the ternary logic circuit has a current ($I_{CON}$) component, which is not affected by the input voltage ($V_{IN}$) and is affected only by the output voltage ($V_{OUT}$), and a current ($I_{EXT}$) component, which is affected by the input voltage ($V_{IN}$) and is not affected by the output voltage ($V_{OUT}$),
the current ($I_{CON}$), which is affected by the output voltage ($V_{OUT}$), is realized via a junction BTBT current ($I_{BTBT}$) independent of a gate voltage,
the current ($I_{EXT}$), which is affected by the input voltage ($V_{IN}$), is realized via a subthreshold current ($I_{sub}$), and
characteristics of the BTBT current ($I_{BTBT}$) and the subthreshold current ($I_{sub}$) are obtained by a simple increase in a channel doping in a binary inverter, so that the binary inverter operates as a ternary inverter.

2. The ternary logic circuit of claim 1, wherein
the current ($I_{CON}$), which is affected by the output voltage ($V_{OUT}$), has a current value $I_C$ when the output voltage ($V_{OUT}$) is half of an operating voltage ($V_{DD}$), that is, ($I_{CON}$)=$I_C$ when $V_{OUT}$=$V_{DD}$/2, and
the current ($I_{EXT}$), which is affected by the input voltage ($V_{IN}$), has a current value $I_E$ when the input voltage ($V_{IN}$) is half of the operating voltage ($V_{DD}$), that is ($I_{EXT}$)=$I_E$ when $V_{IN}$=$V_{DD}$/2, and exponentially increases to a maximum current ($I_{MAX}$) at a point where the input voltage ($V_{IN}$) and the operating voltage ($V_{DD}$) are equal to each other, that is, when $V_{IN}$=$V_{DD}$.

3. The ternary logic circuit of claim 2, wherein a current output from the pull-up device (100) and the pull-down device (200) is calculated by the following equation:

$$I_{OUT}(V_{IN}, V_{OUT}) = I_{CON}(V_{OUT}) + I_{EXP}(V_{IN}),$$
$$= I_C \exp\left[\pm\alpha\left(V_{OUT} - \frac{V_{DD}}{2}\right)\right] + I_E \exp\left[\pm\beta\left(V_{IN} - \frac{V_{DD}}{2}\right)\right]$$

wherein, in the equation, α and β are exponential coefficients of each current mechanism, and + and − signs before α and β are respectively signs applied to the pull-down device (200) and the pull-up device (100).

* * * * *